US010734640B2

(12) United States Patent
Barnes (10) Patent No.: US 10,734,640 B2
(45) Date of Patent: Aug. 4, 2020

(54) NON-CHEMICAL ELECTRIC BATTERY USING TWO-PHASE WORKING MATERIAL

(71) Applicant: Polymorph Quantum Energy Sarl, Arzier-Le Muids (CH)

(72) Inventor: Stewart Edward Barnes, Palmetto Bay, FL (US)

(73) Assignee: Polymorph Quantum Energy (CH)

( * ) Notice: Subject to any disclaimer, the term of this patent is extended or adjusted under 35 U.S.C. 154(b) by 0 days.

(21) Appl. No.: 16/120,080

(22) Filed: Aug. 31, 2018

(65) Prior Publication Data

US 2019/0288278 A1   Sep. 19, 2019

Related U.S. Application Data

(60) Provisional application No. 62/644,068, filed on Mar. 16, 2018.

(51) Int. Cl.
| | |
|---|---|
| *H01M 14/00* | (2006.01) |
| *H01M 4/36* | (2006.01) |
| *H01M 10/42* | (2006.01) |
| *H01M 4/485* | (2010.01) |
| *H01M 4/525* | (2010.01) |
| *H01M 4/02* | (2006.01) |

(52) U.S. Cl.
CPC .......... *H01M 4/364* (2013.01); *H01M 4/485* (2013.01); *H01M 4/525* (2013.01); *H01M 10/425* (2013.01); *H01M 2004/021* (2013.01); *H01M 2010/4271* (2013.01)

(58) Field of Classification Search
CPC ...... H01M 4/364; H01M 4/485; H01M 4/525; H01M 10/425; H01M 2004/021; H01M 2010/4271
See application file for complete search history.

(56) References Cited

U.S. PATENT DOCUMENTS

| | | | | |
|---|---|---|---|---|
| 2013/0130103 | A1* | 5/2013 | Kim | H01M 4/364 429/211 |
| 2017/0352875 | A1* | 12/2017 | Miki | H01M 10/44 |
| 2018/0254477 | A1* | 9/2018 | Horikawa | H01M 4/131 |

* cited by examiner

*Primary Examiner* — Raymond Alejandro
(74) *Attorney, Agent, or Firm* — Bachman Law Group PC (57) ABSTRACT

Much improved energy storage is provided by exploiting the phase transition between different states or phases of a condensed matter "working material." Such phases constitute the high energy "charged" and low energy "discharged" state of the battery. The two phases conduct electricity in a different manner. This is reflected by different chemical potentials that determine the open circuit voltage of the battery. Such a battery can have an energy density that easily exceeds that of current chemical batteries and super capacitors.

22 Claims, 9 Drawing Sheets

NON-CHEMICAL ELECTRIC BATTERY USING TWO-PHASE WORKING MATERIAL

CROSS REFERENCE TO RELATED APPLICATIONS

The present application claims the priority benefit of U.S. provisional patent application No. 62/644,068, filed on Mar. 16, 2018, titled "NON-CHEMICAL ELECTRIC BATTERY USING TWO-PHASE WORKING MATERIAL," the disclosure of which is incorporated herein.

BACKGROUND

Energy storage is a crucial component to increasingly large number situations, e.g., in powering electrical vehicles, portable devices, and storage and mobile use of solar power. The current state of the art has electrical energy stored, e.g., in a battery in chemical form, while in a capacitor it is in an electric field and polarization of a dielectric material, it is in magnetic form in a superconducting loop, in mechanical form in a flywheel generator combination, or gravitational form, in a hydroelectric installation.

The current bench marks for energy sources have nuclear at $1.5 \times 10^{18}$ J/m$^3$ (Uranium breeder reactor) while for fossil fuels $\approx 4 \times 10^{10}$ J/m$^3$ (Kerosene) and current Li-ion chemical batteries $\approx 1 \times 10^9$ J/m$^3$ and $\approx 5 \times 10^7$ J/m$^3$ for super-capacitors. Excluding nuclear power and given fossil fuel engines are less than 50% efficient, an idea electrical battery would correspond to an energy density $\approx 2 \times 10^{10}$ J/m$^3$ and a high-power density, i.e., large currents upon charge and discharge.

Apart from nuclear, all these sources of energy correspond to atomic physics and this implies certain general limits on the energy density. For example, the discharge of a chemical battery involves the transfer of electrons between the outer orbitals of atoms. The energies involved are scaled by the Rydberg 13.6 eV, that is to say that the transfer of an electron involves an energy that are invariably less than or of the order of this and corresponding to a difference of electrical potential difference of about 13.6V.

Since the open circuit terminal voltage is limited by this potential difference, a battery cannot not have a terminal voltage of much more than 10V and cannot store more than about 10 eV per atom. A typical energy storage material, e.g., LiCoO$_2$ has about 10$^{28}$ atoms/m$^3$ and the ideal limit is $10V \times 1.6 \times 10^{-19}$ J/V$\times 10^{28} \rightarrow 1.6 \times 10^{10}$ J/m$^3$. If the electronic process involves 2 or 3 electrons per atom, there is a potential gain by the corresponding multiple. The $1.6 \times 10^{10}$ J/m$^3$ is about a factor of twenty greater than the best chemical Li-ion battery today. Since the electric field that a material can withstand without breakdown is similarly limited, this estimate also applies to capacitors and the phase transition battery described here. If energy is measured in, e.g., kWhr/kg then lighter elements such as Li, Na, Mg or Al are favored by factors of 2-3 over the 3d transition metals such as Co or Fe.

Chemical batteries have a limited power density that reflects the slow ionic transport and results in poor charge and discharge performance. Furthermore, the reliance of existing batteries on ionic transport invariably causes high degradation rates of the batteries. On the other hand, capacitors involve rapid electronic transport with a correspondingly higher power density but have a very small fraction of useful working material and correspondingly small energy densities.

What is needed is an improved energy storage technology.

SUMMARY

The present technology, roughly described, uses an energy storage material that occupies most of a battery volume and operates via electronic transport. The energy storage material, of approximately fixed volume, includes a first portion of a working material having a first phase and higher absolute energy density, a second portion of a working material having a second phase and a lower absolute energy density. These are separated by a domain (or phase) wall. There is an external circuit that connects the first and second portions of the material. As the first order phase transition proceeds, the domain wall is displaced causing the volume of the first portion to increase at the expense of the volume of the second portion and decreasing the total stored energy. This spontaneous domain wall motion, corresponding to discharge, causes a current to flow in the external circuit. During the charging cycle a current is driven in the opposite sense causing the domain wall motion to be reversed. Now the proportion of the first, high energy density portion, increases at the expense of the second low energy part and the total stored energy is restored.

In an embodiment, an electrical energy storage device includes a working material having a first portion and a second portion. The first portion of the working material has a first phase and a first energy density. The second portion of the working material has a second phase with a second energy density that is different than the first energy density. A phase wall separates the first portion and the second portion of the working material. The working material undergoes a phase transition between the first phase and second phase, and the phase wall moves, and during charge of the electrical energy storage device, electrical energy is added to the device. During discharge of the electrical energy storage device, electrical energy is extracted from the device.

DETAILED DESCRIPTION

The present technology, roughly described, is an energy storage material that occupies most of a battery volume and operates via electronic transport. The energy storage material, of approximately fixed volume, includes a first portion of a working material having a first phase and higher absolute energy density, a second portion of a working material having a second phase and a lower absolute energy density. These are separated by a domain (or phase) wall. There is an external circuit that connects the first and second portions of the material. As the first order phase transition proceeds, the domain wall is displaced causing the volume of the first portion to increase at the expense of the volume of the second portion and decreasing the total stored energy. This spontaneous domain wall motion, corresponding to discharge, causes a current to flow in the external circuit. During the charging cycle a current is driven, by an external power source, in the opposite sense causing the domain wall motion to be reversed. Now the proportion of the first, high energy density part, increases at the expense of the second low energy part and the total stored energy is restored.

The present technology includes working materials having different structural or chemical phases. Many materials such as water exist in more than a single phase, for this example ice, liquid water and steam that can exist together as pairs, e.g., water and ice, or as all three at the triple point. For a first order phase transition, such as that between water and steam, even when they have the same temperature, there is a difference in free energy between the pair of phases, here steam and water, that for equilibrium thermodynamics corresponds to the latent heat of transformation. Steam is dangerous and can burn the skin, not so much because it is hot but because of its latent heat. Because the electrical conductivity of water and steam (or ice) are different at a given temperature, when e.g., an ice/water interface moves, due to say a slight change in the external pressure, there will be produced a non-conservative, i.e., motive force that can cause a current to flow in an external circuit. While not a practical device, this illustrates the concept of first order phase transition batteries.

Usually, in conducting materials in equilibrium, the chemical potential is the same everywhere. This is clearly not the case in the windings of an electrical generator where the chemical potential at the terminals differs by the electromotive force (EMF) generated within the winding. The EMF balances the chemical potential difference that is the measured as, the usually AC, voltage of the generator. Similarly, with a suitable two-phase material during charge/discharge, a DC chemical potential difference is maintained by the motive force that is produced by the movement of the phase boundary in space.

Figure 1:
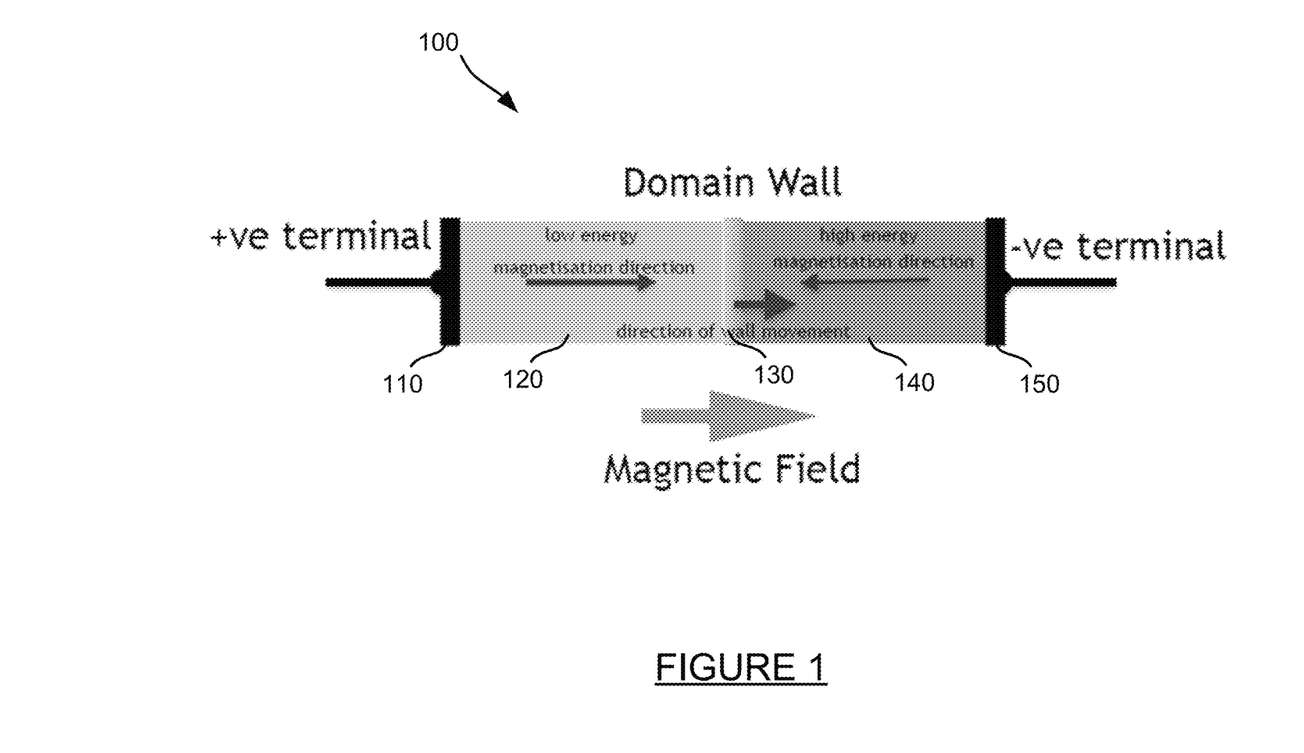
FIG. 1 is a block diagram of a ferromagnetic wire having magnetic domain wall which drives a spin motive force.

As described by Barnes and Maekawa, "Generalization of Faraday's law to include nonconservative spin forces" Phys. Rev. Lett., 98, 246601 (2007), which differs from the mechanism behind the present technology, a spin-motive force (SMF) is driven by a magnetic domain wall in a ferromagnetic wire. FIG. 1 is a block diagram of a ferromagnetic wire having magnetic domain wall which drives a spin motive force. As illustrated in FIG. 1, for a spin battery 100, a magnetic domain wall 130 separates a region 120 of a metallic ferromagnetic material in which the magnetization points parallel to an applied magnetic field and has low energy density from a region 140 where the opposite is true and for which the energy density is larger. As is observed by Hayashi et all., "Time-domain observation of the spin-motive force in permalloy nanowires" Phys. Rev. Lett., 108, 147202 (2012), the motion of the wall to the right, during discharge, produces an SMF that is balanced by a change in the chemical potential so that the right terminal 150 is negative while the terminal 110 to the left is positive. Both domains are made of the same magnetic material. The terminals comprise non-magnetic materials that makes a good electrical contact to the ferromagnetic bar. The wall moves in the opposite sense during charge when energy is provided by an external electrical energy source. When the magnetic wall separating the two regions moves in the sense that lowers the total energy, there is an SMF that maintains a chemical potential difference across the ends of the wire that in turn drives the current in an external circuit.

The EMF reflected in the traditional form of Faraday's law of electromagnetic induction is a reflection of the electro-magnetic forces that with the weak, strong and gravitational forces is one of the fundamental forces of Nature. This EMF corresponds to the conversion of energy stored in the electric $\vec{E}$ and magnetic $\vec{B}$ fields into electrical energy. While the SMF does not reflect a new fundamental force, it does reflect the spontaneous broken symmetry of a ferromagnetic material and corresponds to the conversion of energy stored in the magnetic order parameter associated with that broken symmetry. It follows that such a spin-battery has an energy density that is limited by what can be stored in magnets. This density is characterized by the $\vec{M} \cdot \vec{H}$ product and is limited to less than $\sim 10^6$ J/m$^3$ for the best permanent magnets, e.g., $Nd_2Fe_{14}B$, $SmCo_5$, and so forth.

It is relevant to the present invention that all solids have broken translational symmetry and that many have different polymorphs, i.e., different materials with a given chemical formula. For example, $Fe_2O_3$, can occur in different crystal structures, such as rhombohedral, cubic, cubic body-centered, and so on, for this example. It is also important that certain crystal growth techniques, e.g., pulsed laser deposition (PLD), with suitable growth conditions and substrates, can be used to grow such polymorphs at will. Of the four commonly recognised insulating crystalline phases of this iron (III) oxide: $\alpha$-$Fe_2O_3$ (hematite), $\beta$-$Fe_2O_3$, $\gamma$-$Fe_2O_3$ (maghemite), and $\epsilon$-$Fe_2O_3$, hematite is found in nature, while $\alpha$-$Fe_2O_3$, $\gamma$-$Fe_2O_3$, and $\epsilon$-$Fe_2O_3$, along with the conducting mixed valent $F_3O_4$ can be grown, e.g., using PLD and similar techniques.

These different phases have a different energy associated with the order parameter that, for the example, implies the rhombohedral $\alpha$-$Fe_2O_3$ is the ground state, i.e., has the lowest energy at ambient pressure. Under high pressure yet another polymorph, h-$Fe_2O_3$ with a different energy, appears in which the $Fe^{3+}$ ions undergo a transition from high spin (HS) to low spin (LS). The present invention is based upon the identification of certain materials that undergo first order phase transitions between different such polymorphs, for their ability to store electrical energy.

There are first order transitions that occur between phases with different electrical character, insulator-insulator, metal-insulator and metal-metal that might also have different structures, conduct differently, and hence have different chemical potentials. In this classification semi-conductors are insulators with a small gap and superconductors are metals without resistance. To compete with the best chemical batteries, an energy difference between two quasi-stable phases of ~10 eV/atom is required. Such materials are not common but do exist.

The production of electrical energy by an electrical generator reflects Faraday's law of electromagnetic induction, i.e., the usually defined EMF is associated with the forces acting upon electrons and due to the electric $\vec{E}$ and magnetic $\vec{B}$ fields. These electromagnetic forces, mediated by photons, can be related to the Aharonov-Bohm phase. This is the U(1) Berry phase associated with charge.

Everyday forces such as the pressure exerted by wind on a windmill sail can be understood, in principle, in terms of a suitably defined Berry phase in a mathematical approach based upon what is known as a gauge group. The SU(2) gauge group is associated with the electron spin and the SMF produced by ferromagnetic materials can be understood on in terms of emergent forces and the SU(2) gauge group. These non-conservative emergent forces are associated with texture in the ferromagnetic order parameter and correspond to the exchange of momentum with the relevant condensate. With momentum is the exchanged energy, that is the engine behind the SMF.

In the case of a Faraday's law EMF, the Berry connection, usually called the vector potential $\vec{A}(\vec{r},t)$ is a non-unique but fundamental quantity, a function of the position $\vec{r}$ of an electron at time t, such that the EMF, ε, defined by $$\mathcal{E} \equiv \oint_C \vec{E} \cdot d\vec{r} = -\frac{d}{dt}\oint_C \vec{A} \cdot d\vec{r} = -\frac{d\Phi_B}{dt}$$

where to the right of this equation appears the magnetic flux $\Phi_B = \oint_S \vec{B} \cdot d\vec{S}$ that passes through the contour C and $\vec{B}$ is the magnetic field. The definition of $\Phi_B$ involves a surface integral, of the magnetic field $\vec{B}$, over any contour that closes on C. This flux, proportional to the U(1) Berry phase, is directly given as $\Phi_B = \oint_C \vec{A} \cdot d\vec{r}$ in terms of the connection $\vec{A}$ that reflects the usual electric $\vec{E}$ and magnetic $\vec{B}$ fields. Different for an SMF is that the connection $\vec{A}_s(\vec{r}, t)$ is no longer a simple function of $\vec{r}$, t, but rather is a two by two matrix written in terms of the Pauli matrices $\vec{\sigma}$, which is a reflection of the electron spin internal degree of freedom that is responsible for the ferromagnetism. When put in diagonal form, the SMF $\varepsilon_s$, given by the above formulas, has equal but opposite magnitude as the electron has "up" or "down" spin and a net force only exists in a ferromagnetic material. While the SMF and the connection $\vec{A}_s(\vec{r},t)$ do not reflect any new fundamental forces, they do reflect the spontaneous broken symmetry of a ferromagnetic material. Thus, while $\vec{A}(\vec{r},t)$ reflects the conversion to electrical energy, the energy stored in the electromagnetic field, $\vec{A}_s(\vec{r},t)$ reflects the similar conversion of energy stored in the ferromagnetic order parameter and associated with the relevant broken symmetry. It follows that a spin-battery has an energy density that is limited by what can be stored in magnets. This density is characterized by the $\vec{M} \cdot \vec{H}$ product and is limited to less than ~$10^6$ J/m³ for the best permanent magnets, e.g., $Nd_2Fe_{14}B$, $SmCo_5$, and so forth.

The EMF relevant to the present invention also does not correspond to fundamental forces but, in analogy with the SMF, corresponds the translation broken symmetry that is characteristic of a solid but wherein the connection $\vec{A}_p(\vec{r},t)$, like the fundamental $\vec{A}(\vec{r},t)$, is not a matrix but rather a simple function of $\vec{r}$, t. It reflects lattice textures and in particular the lattice distortions that arise as one phase translates into another at a phase (or domain) wall. The EMF arising in such a wall is again a non-conservative, non-fundamental force that now corresponds to the conversion of lattice, and certain related energies, into electrical energy. The electrical energy density that can be stored is limited by the difference in energy density of different phases of a solid (or liquid) that can be smoothly connected by a phase wall.

When charging a battery based upon two phases an electrical pressure replaces the mechanical pressure, i.e., the phase transition that would normally only occur at high pressure can be induced by applying a voltage difference across the phase wall. When the battery discharges, with a small load, the same voltage difference, across the wall, is maintained by the EMF generated within the wall. The near stationary wall separates the low energy phase from the high energy equivalent that usually would only be found at high pressure. For such an embodiment of the present technology, there is a coherent transformation between the two phases with a single phase-wall. In order to avoid the formation of many phase domains, very high-quality single crystal rods or thin films are used, as might be grown by a number of techniques known to those versed in the art of materials science.

These concepts permit the design of a battery that approaches the atomic physics limits described above.

Figure 2:
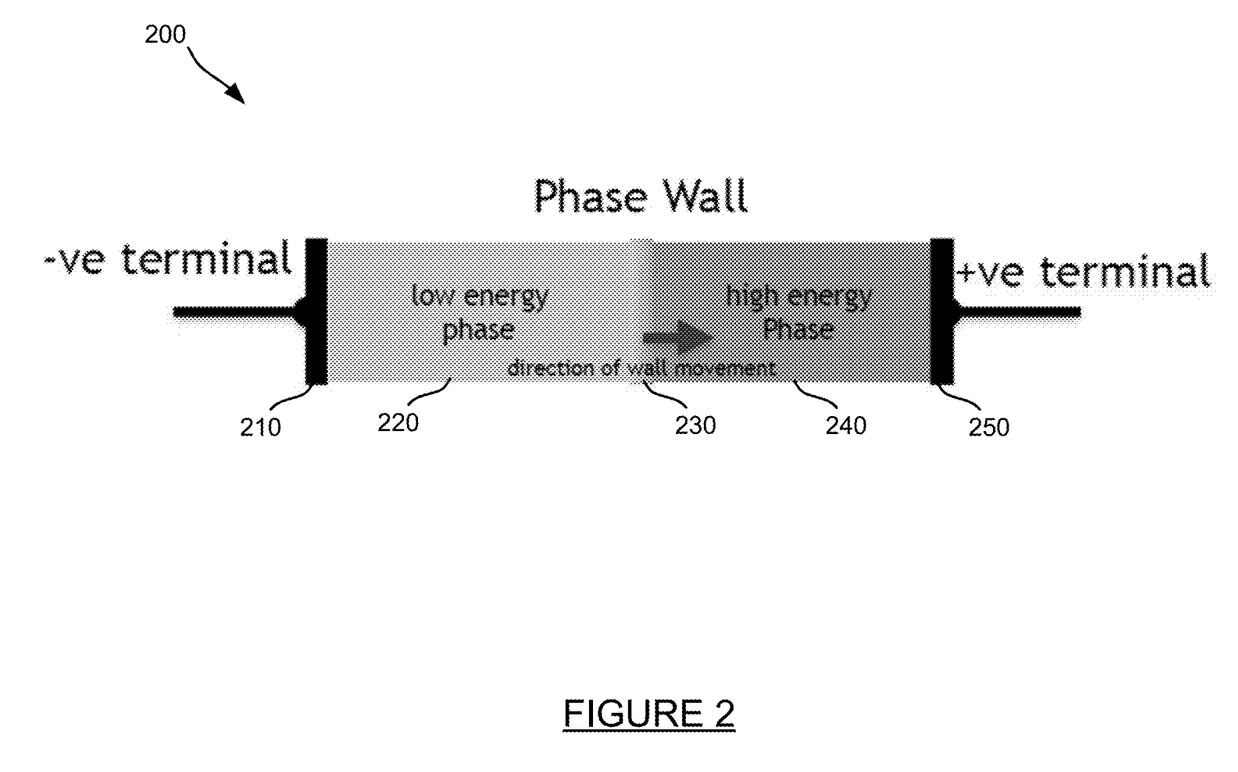
FIG. 2 is a block diagram of the basic structure of an energy storage device.

FIG. 2 is a block diagram of the basic structure of an energy storage device. In the basic structure, a phase transition battery 200 consists of a single piece of working material that makes a good electrical contact to metallic terminals 210 and 250. Two phases of the working material—a first phase associated with portion 220 and a second phase associated with portion 240—are separated by a phase wall 230. In passing through the wall, a crystal structure evolves smoothly from one structure in the first portion to the structure in the second portion. The difference in the electronic and lattice energy is recovered as electrical energy when charge carriers pass through the surfaces of the working material. The indicated sense of the terminal voltage reflects electron, rather than hole, transport.

The energy storage device comprises a slab of the working material, i.e., the substance that stores the energy, with contacts 210 and 250 at each end. The portion 220 near one electrode 210 is in the lower energy phase (phase 1) while portion 240 having a different phase (phase 2) of higher energy is near the second electrode 250. The two phases are separated by a domain (or phase) wall, through which one phase deforms smoothly into the other. It is emphasized that the two-phase regions, and the phase wall, are all made of the same material. A simple illustrative example would be the metal vanadium (V) for which the lower energy state has the body-centered cubic "1" phase (bcc) and with a tetragonal higher energy "2" phase. Within the domain wall, one phase is continuously deformed into the other following an energy minimum Bain path described by a single (lattice) parameter a.

Figure 3:
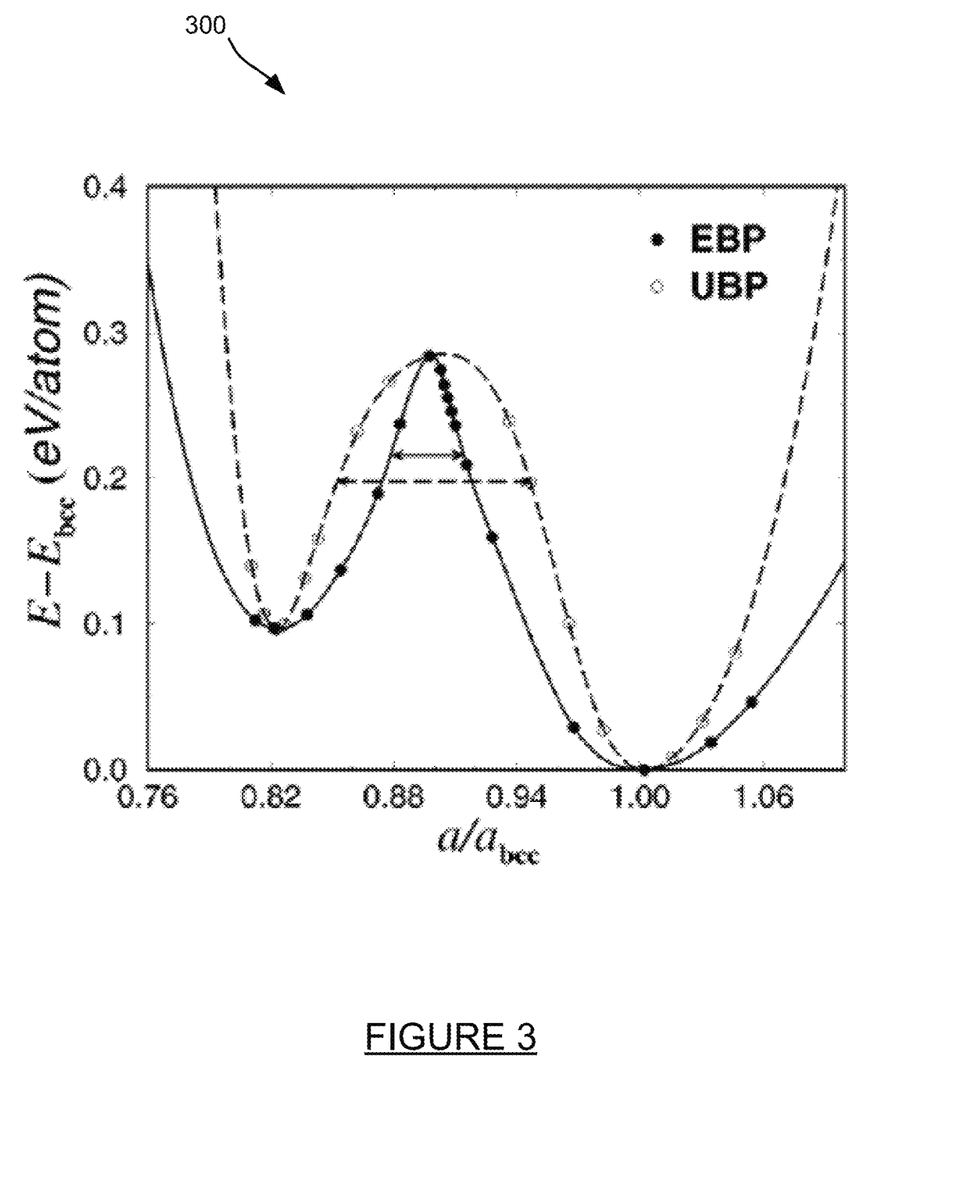
FIG. 3 illustrates plots of the energy E, minus the value for the bcc structure, in eV/atom.

In Alippi et al., "Strained tetragonal states and Bain paths in metals" Phys. Rev. Lett. 78, 3892 (1997), the energy is calculated as a function of a as shown in FIG. 3. FIG. 3 illustrates a graph 300 that plots the energy E, minus the value for the bcc structure, in eV/atom along two possible Bain paths, i.e., epitaxial Bain path (EBP) and the uniaxial Bain path (UBP) for vanadium between the minima and through the saddle point.

For vanadium, the difference in energy between the two phases is about 100 meV. This is reflected by a terminal voltage of about 0.1V, and rather too small to be of practical use for most applications. An estimation of the energy density is given below. The large barrier height of 200 meV between the locally stable minima at $a=a_0$ and a $\approx 0.82a_0$ assures that the thermally activated classical relaxation, i.e., classical wall motion, is negligible when the battery is operating near room temperature. Given an adequate barrier, the details of the Bain path in real space, i.e., the phase wall structure is of little importance.

Reflecting the nature of the mechanical forces that occur when the working material is deformed, the entire phase wall can be displaced by an electrical current. For more than eighty years, it has been understood that such non-fundamental forces, of electronic origin, are described by the adiabatic Born-Oppenheimer approximation. The overall motion of the atoms is much slower than that of the electrons within the atoms, thus when, e.g., an $H_2$ molecule is stretched it is the adiabatic changes in the orbital composition of the bonding levels that provides the (non-fundamental) restoring force. The change in energy of the phase wall, along the Bain path, is due to a change in the orbital character of the conduction electrons. In an adiabatic process, there is conservation of both the energy and overall momentum. The energy is conserved because the conduction electrons see an effective potential energy $eV(x(t), \vec{r})$ that is time dependent via $x(t)$ the time dependent position of the phase wall. In quantum theory, any object, such as the phase wall, with a position $x(t)$ have a conjugate momentum operator $p_x$ such that $e^{ixp_x/\hbar}$ is the displacement operator. Thus, the inverse transformation $e^{-ix(t)p_x/\hbar}$ acting upon the many-body wave-function $\psi$ eliminates the wall motion rendering the problem stationary. Substituting $e^{-ix(t)p_x/\hbar} \psi$ into a Schrödinger equation leads to the self-consistent condition that $$v = \frac{dx}{dy} = v_d,$$

the uniform conduction electron drift velocity in the x-direction, and determines the wall velocity v.

The now stationary potential $eV(x(t=0),\vec{r})$ is then "gauged away" by adding a factor $e^{i\alpha(\vec{r},t)}$, such that $\hbar \partial_t \alpha(\vec{r},t) = eV(x(t), \vec{r})$. A "no force condition" can be written as $-\partial_t eA_m - \partial_x eV(x(t), \vec{r}) = 0$, where $\vec{A}_m = \vec{\nabla} \alpha(\vec{r},t)$. Despite appearances, because passing a conduction electron through the wall causes a displacement, $-\partial_t eA_m$ is non-conservative. If in the original problem the change in potential energy across the wall $e\Delta V = \Delta\mu$, the change in the chemical potential, then if n is the number of electrons, $\Delta E$ is the difference in energy between the two phases, both per unit cell, then $ne\Delta V = \Delta E$ by the conservation of energy. It is the difference $\Delta\mu$ in chemical potential that determines the voltage $\Delta V$ measured across the terminals of the battery and that causes a current to flow in an external circuit.

The results $v = v_d$ for the phase wall velocity and $ne\Delta V = \Delta E$ for the terminal voltage $\Delta V$ of the battery stem from the conservation of momentum and energy respectively. Viewed with this perspective indicates a couple of subtle points. First, $v_d$ is the mass weighted sum of the drift velocity of the electrons and holes and that n in $ne\Delta V = \Delta E$ involves the difference in the number of electrons and holes per unit cell.

For the example of V metal, from FIG. 3 and the difference in the energy minima, the battery terminal voltage is $\approx 0.1V$ and an energy density of $1.6 \times 10^{-20}$ J/[$(2.93)^3 \times 10^{-30}$]$\approx 6 \times 10^8$ J/m$^3$ or with a mass density of 6,000 kg/m$^3$ about 0.1 MJ/kg comparable to a Pb-acid battery at 0.17 MJ/kg. Most simple metals have different polymorphs, e.g., Sn, Ti, Fe, Co, Ni etc., and their alloys, and might be used as a working material. Because of the smallish energies involved, the material must be extremely pure and crystalline in order to avoid pinning of the domain wall.

Some such alloys, e.g., FeRh undergo first order transition between a higher energy ferromagnetic metal (FM) and an antiferromagnetic metal (AFM) with a structural phase transition and a volume change of about 1%. The energy density associated with the magnetic exchange energy is different for the two materials and this contributes to the electrical energy that can be stored. The terminal voltage a battery working with FeRh will have a terminal voltage of only $\approx 0.1$-$0.2V$ but other materials have potentially larger contributions reflecting larger internal exchange fields and larger volume changes.

The so called "shape memory alloys" undergo a martensite-austenite phase transformation. According to calculation, the Heusler composition $Ni_2CoAl$ has a more than adequate barrier height of 0.5 eV and a predicted terminal voltage of $\approx 0.22V$ and a correspondingly higher energy density than the elemental metals. Similarly, the half Heusler $Ni_2CoB$ would produce a terminal voltage of 0.35V. Of the half-Heusler alloys, LiMnN has $\alpha$ and $\beta$ polymorphs that differ in energy by over 2 eV. Heusler intermetallic compounds with a 1:1:1 composition (often called Half-Heusler) or 2:1:1 composition comprise more than 1500 members of which many have different polymorphs and might serve as working materials.

The Wurtzite ABC compounds have a significant energy difference between the ideal $P6_3mc$ and distorted $P6_3mmc$ polar space groups. For the example LiZnSb, calculation gives a difference of $\approx 1.0$ eV between these structures and, while the Wurtzite structure is unstable, it is implied that similar materials of this structure would have a terminal voltage of about 1V. These Wurtzite ABC compounds can be classed as combinations into the following groups: I-III-IV (e.g. LiGaGe), I-II-V (e.g. LiBeSb), I-XII-V (e.g. LiZnSb), XI-III-IV (e.g. CuYSn), XI-II-V (e.g. AgCaBi), and II-XII-IV (e.g. CaZnSn). Many have been fabricated with many more being potential candidate working materials.

It is an important ingredient in the design of a working material that the physical size of an atom depends upon is spin and charge state, along with its atomic coordination, e.g., Ti with six fold coordinate has ionic radii of 0.86, 0.67 and 0.61 Å for the charge state +2, +3 and +4 respectively. Similarly, with the same coordination +2 Fe has high spin (HS) and low spin radii of 0.78 and 0.61 Å while for +3 Fe these are 0.65 and 0.55 Å and HS +3 actually has a larger ionic radius 0.65 Å that LS +2 Fe with radius 0.61 Å.

The high to low spin transition, with or without an ionic charge transfer, is a possible ingredient in the design of the working material. For example, elemental Fe in the face centered cubic structure (fcc) has an energy that is smaller by ~150 meV for the LS than for the HS equivalent. Elemental Fe actually assumes a HS body centered cubic (bcc) structure but is stabilized as fcc in Fe—Ni alloys. Such an alloy with $\approx 30\%$ of Ni, known as "Invar", is important technically due to its very small coefficient of thermal expansion. This reflects the small ionic size of the LS state that is almost degenerate with the HS equivalent at this composition. The volume is ~3-5% lower in the LS phase.

Between 0-40% Ni such alloys exist in two phases, i.e., anti-taenite and taenite, and constitute minerals that have the same fcc crystal structure and same chemical composition (same proportions of Fe and Ni), but differ in their electronic structures: taenite has a high magnetic moment (HS) whereas anti-taenite has a low magnetic moment (LS).

An EMF phase battery based upon elemental Fe (and Fe:Ni alloys) as the working material might complete with Pb-acid. Many other 3d metals, e.g., Mn Co and Ni, and/or simple alloys also show the HS/LS effect and are also potential working materials. HS/LS transitions also occur in 4d and 5d metals and alloys, and these also constitute potential working materials.

Magnetite, $Fe_3O_4$ contains both $Fe^{2+}$ and $Fe^{3+}$ ions and is conducting at ambient conditions. Calculations show this undergoes a ~10% volume change, at a critical pressure $P_c$~30 GPa, implying an energy density of ~$3\times10^9$ J/m$^3$ associated with a HS to LS transition. This pressure is such that the work done by the volume change is equal to the difference in energy density between the polymorphs. When charging a battery an electrical pressure replaces the mechanical pressure and the HS to LS transition can be induced by applying a voltage difference across the phase wall. When the battery discharges the same voltage difference, across the wall, is maintained by the EMF generated within the wall, i.e., the near stationary wall separates the low energy HS $\alpha$-$Fe_3O_4$ from the high energy LS h-$Fe_3O_4$ usually only found at high pressure. This same principle extends to the examples detailed below.

Perovskites oxides have the formula $ABO_3$, e.g., the ferrite $LaFeO_3$ for which the formal valences are $La^{3+}$, $Fe^{3+}$ and $O^{2-}$. In such simple oxides the A-element is the larger of the two ions. Typically, the A ion is La, Sc, Sm, Ce, Er, Gd, Ho, Nd, Pr, Tb, Tm, Y, Lu, Bi, Dy, while the B ion might be taken from Cr, Fe, V, Mn, Ti, Ni, Al, or Ga. More generally, the sum of the valence of the A and B ions must be six. Also, A might be a monovalent Li, Ag K, Na, Cs, Tl, Rb while B would be Nb, Ta, U W, V, I, Sb Bi and for divalent A ions, Ba, Ca, Sr, Ba, Pb with B being V, Hf, Ma, Ru, Sn, Ce Ru, Zr, Mo, U, Th, Ti, Pr, Pb, or Mn. Perovskites exist in which oxygen is replaced by F, e.g, $KMnF_3$, $KFeF_3$, $KCoF_3$, $KNiF_3$, $KCuF_3$ or by Cl, Br I, Si, etc. Organic perovskites e.g., $CH_3NH_3SnI_3$ also exist along with mixed cations and anions. More complicated are the layered perovskites that consist of two-dimensional perovskite slabs interleaved with cations or cationic structural units. The Dion-Jacobson series of layered perovskites, $A'[A_{n-1}BnO_{3n+1}]$, typified by the n=3 phase $CsCa_2Nb_3O_{10}$ which has one interlayer cation per formula unit. Ruddlesden-Popper phases, $A'_2 [A_{n-2}BnO_{3n+1}]$, such as $K_2La_2Ti_3O_{10}$, have two interlayer cations per formula unit and possess twice the interlayer charge density of the Dion-Jacobson phases.

Aurivillius phases, including $Bi_2W_2O_9$ are intergrowths of perovskite and bismuth oxide and have a covalent network of $Bi_2O_2^{2+}$. Many such combinations are potential working materials that can be grow by a number of methods well known to those versed in the art.

In designing perovskite working materials, the restriction on large A and small B ions implies, e.g., that the 3d ion $Cu^{3+}$ cannot be readily used as an A ion, limits the possibilities. In the search for materials that exhibit charge transfer phase transitions, more complicated crystal structures are considered.

As described by Shimakawa, "Crystal and magnetic structures of $CaCu_3Fe_4O_{12}$ and $LaCu_3Fe_4O_{12}$: distinct charge transformations and unusually high valence Fe", J. Phys. D: Appl. Phys. 48 504006 (2015), such an embodiment of a working material is illustrated by the ordered triple perovskite $LaCu_3Fe_4O_{12}$. This can be prepared at 10 GPa and 1,400K with a cubic anvil-type high pressure apparatus. The starting materials are $La_2O_3$, CuO and $Fe_2O_3$, and $KClO_4$ might be used as an oxidizing agent. The residual KCl and a small amount of impurities were washed out using a dilute acid solution. Other growth methods are known to those versed in the art.

Figure 4:
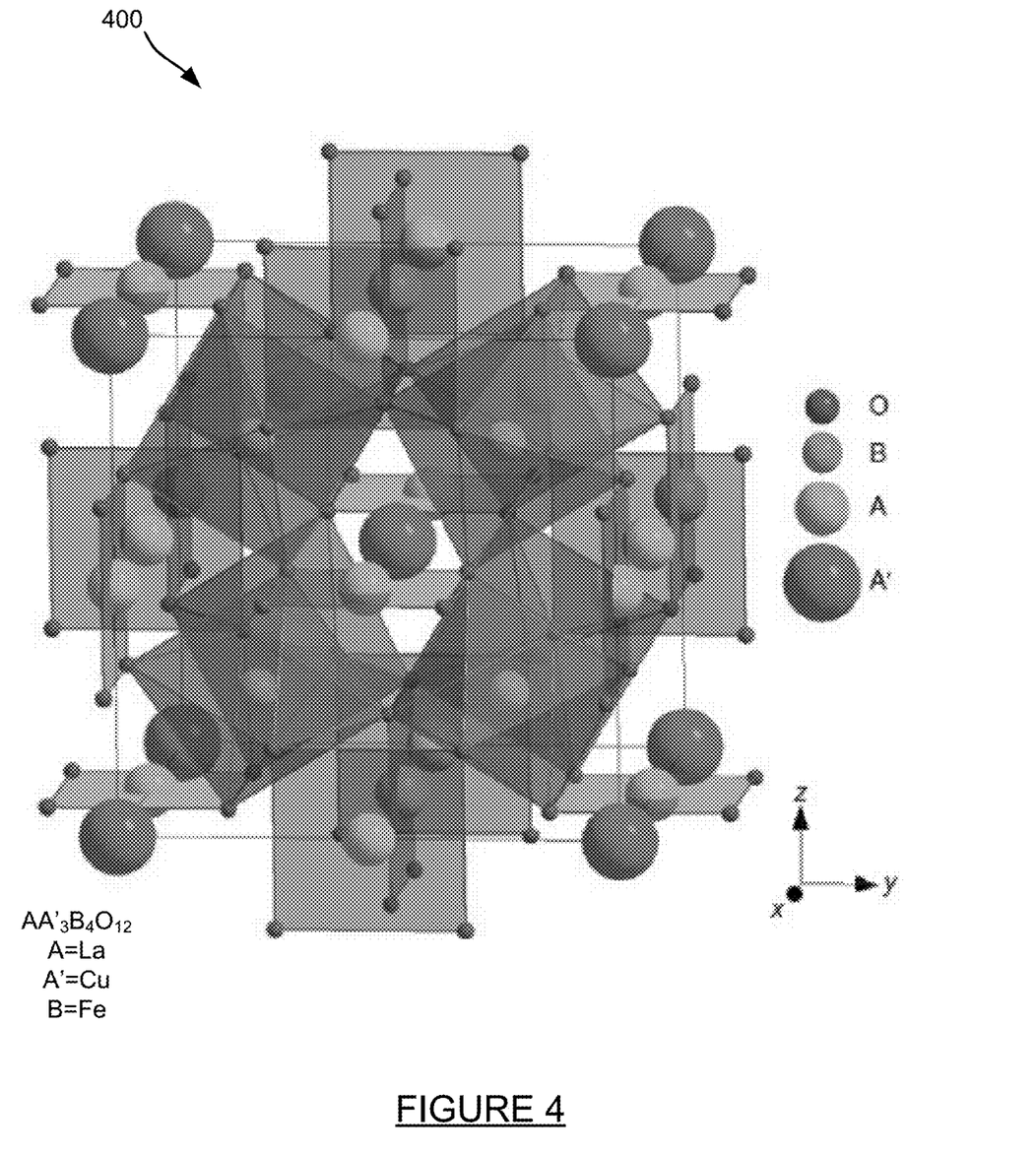
FIG. 4 illustrates a crystal structure of an ordered tripe perovskite AA'$_3$ B$_4$O$_{12}$.

FIG. 4 illustrates a crystal structure of an ordered tripe perovskite $AA'_3 B_4O_{12}$. The structure 400 admits at the A'-site small ions that would usually only be found in the B-site in the defining perovskite structure $ABO_3$. The sum of the valence of the A, plus three times that of A' and plus four times that of B should be 24. It is now possible to have at the A'-site 3d ions Ti, Cr, Mn, Fe, Co, Ni Cu that can assume many valence states, e.g. 2+, 3+ 4+ and 5+. The A and B sites are occupied by ions found at those sites in $ABO_3$ and listed above. Thus, for the example $LaCu_3Fe_4O_{12}$, the low energy polymorph has the formal valence $A'^{3+}=Cu^{3+}$ and is quite rare and energetically unfavorable. For this reason, $LaCu_3Fe_4O_{12}$ has two isomorphs one, an insulator, with the standard formal valences $La^{3+}$, $Cu^{3+}$ and $Fe^{3+}$ and the other, a metal, with $La^{3+}$, $Cu^{2+}$ and $Fe^{3.75+}$ and with a higher energy. Upon applying a pressure of 3.5 GPa there is a charge transfer of one electron from Fe to Cu causing the first valence scheme to turn into the second and thereby inducing an insulator to metal transition. The volume change is 2.0%, i.e., the amount of work done in the phase change is only $7\times10^7$ J/m$^3$. However, as can be appreciated from FIG. 4, in the perovskite structure the A' and B atoms occupy different planes. The transfer of an electron per atom between these planes produces a double layer and hence generates a potential difference of 5-20V between the planes. It is implied that $LaCu_3Fe_4O_{12}$-x, electron doped e.g., by an oxygen deficiency of x ≈1 is a conductor in the low-pressure phase with a lower total energy reflecting this potential difference, or equally, the ~3 eV electron affinity measured, e.g., for $Cu^{3+}$ in $Cu_2O_3$ clusters. An embodiment of a battery of the present technology using $LaCu_3Fe_4O_{12-x}$, or similar variants, as a working material might have an energy capacity 3-10 times that of Li-ion. Such a metal to metal charge transfer occurs, e.g., in $LaCu_3Cr_4O_{12}$ and many more ordered $AA'_3 B_4O_{12}$ and $AA'_3 B_2B'_2O_{12}$ perovskite compounds.

The working material might also be the tri-color ordered triple perovskite such as $LaBi_2AlFe_2O_{9-x}$ with a finite x~1 to provide electron doping. This is produced by standard milling and sintering from beginning oxide materials at either ambient or elevated pressure and temperature. Thin films can be deposited by PLD, magnetron spluttering, or other similar methods to produce layers of the working material. Electron doping also results from the partial or whole substitution of La by V, Cr, Ti, Zr, Hf or Ce, etc.

Figure 5:
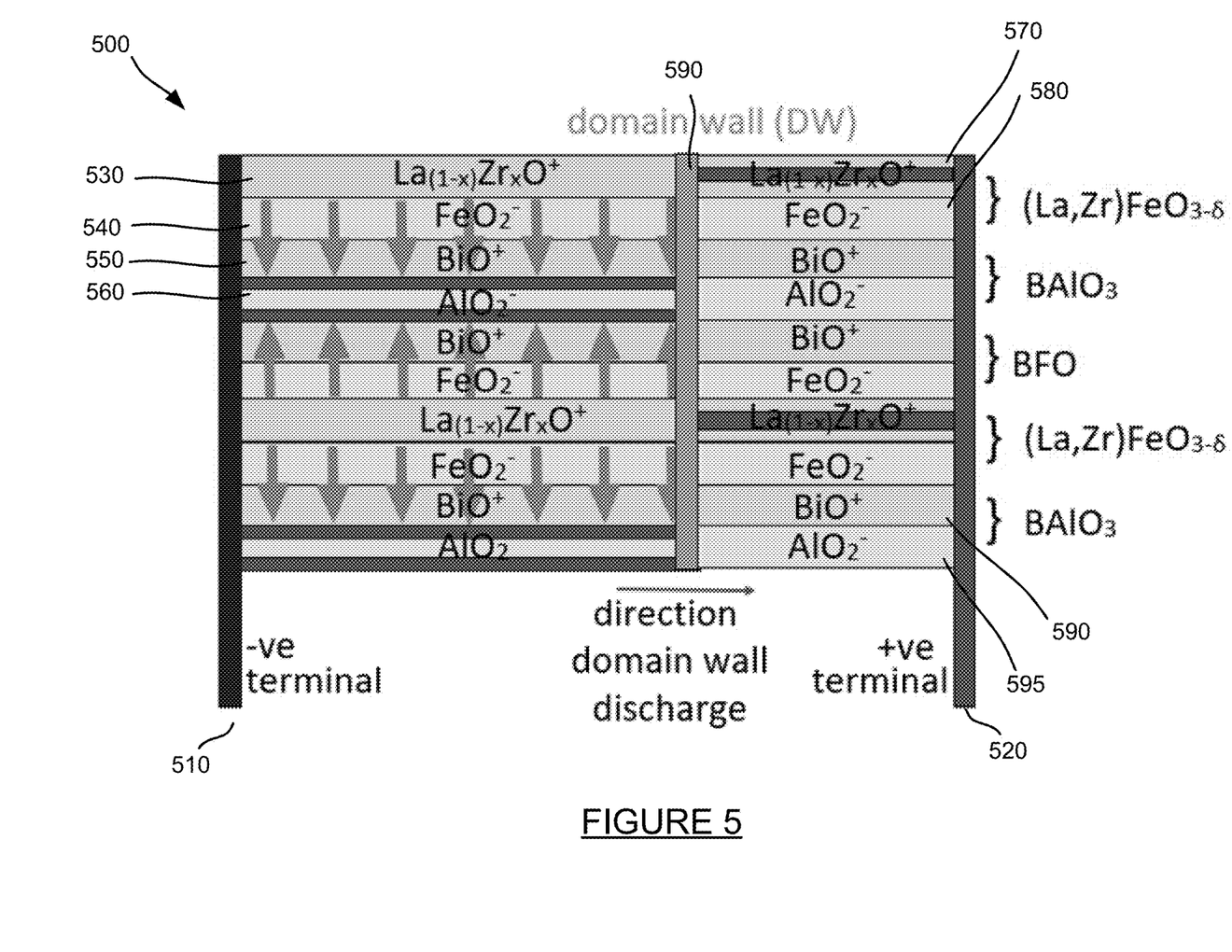
FIG. 5 illustrates the schematic structure of the tri-color ordered triple perovskite LaBi$_2$AlFe$_2$O$_{9-x}$.

FIG. 5 illustrates the schematic structure 500 of the tri-color ordered triple perovskite $LaBi_2AlFe_2O_{9-x}$. The high energy non-polar phase is to the right and separated by a phase domain wall 590 from the lower energy non-polar phase to the left. The arrow indicates the direction of the wall motion during discharge. Also illustrated are the terminals 510 and 520 that make good electrical contact to the edges of the working material as in FIG. 2.

The four layers comprise A≡LaO+(530), B≡$FeO_{2-}$ (540), C≡BiO+ (550), and D≡$AlO_{2-}$ (560) in the order ABCDCBA, and so on. The simple perovskite BFO≡$BiFeO_3$ is ferroelectric and $LaBi_2AlFe_2O_{9-x}$ can be viewed as (LaO+) BFO ($AlO_{2-}$) BFO (LaO+) BFO ($AlO_{2-}$) where the layers (LaO+) and ($AlO_{2-}$) produce an enormous internal electric field that biases the ferroelectric BFO to be polarized towards the ($AlO_{2-}$). The BFO comprises the layers C≡BiO+ (550) and B≡$FeO_{2-}$ (540) and the arrows in the polar state show the sense of the electrical polarization of these layers. To the right the same layers have no such polarization. This material might be fabricated by layer-by-layer deposition of the perovskite sequence LFO≡LaFeO$_3$, BFO, BAO≡BiAlO$_3$, LFO, and so forth, using PLD or similar techniques or by the direct deposition of a layer (LaO+) using an La oxide La$_2$O$_3$ target followed by BFO and AlO$_{2-}$ using an Al$_2$O$_3$ target. All four layers A, B, C D might be deposited using La$_2$O$_3$, Fe$_2$O$_3$, Bi$_2$O$_3$ and Al$_2$O$_3$ targets respectively. The perovskite layers exfoliate in suitable solvents and the necessary layer structure might also be formed by Langmuir-Blodgett deposition. Thin films might also be deposited by PLD and other methods, directly from bulk LaBi$_2$AlFe$_2$O$_{9-x}$.

Throughout the description of the present technology herein, the structure 500 of FIG. 5 may be directly or indirectly referenced, for example, by indicating that the wall moves "to the right" or that charge conducts to the right or to the left of the wall. Such references to direction (e.g., to the right or to the left) are intended to be with reference to the structure illustrated in FIG. 5.

In order to make the material conductive, electrons are added by the reduction of O$_9$ to O$_{9-x}$, thereby creating oxygen deficiency sites of concentration x and/or by the whole or part substitution of La$^{3+}$ by Ti$^{4+}$, or other elements from the fourth column of the periodic table, on layer 530. This oxidation can be performed by a number of well-known techniques either during or after deposition. A (La,Ti)FeO$_3$ or TiFeO$_3$ layer might be deposited instead of LaFeO$_3$, or the La$_2$O$_3$ target might be replaced by (La,Ti)$_2$O$_3$ or Ti$_2$O$_3$ or TiO$_2$, as target. Since it provides two electrons, the substitution of La$^{3+}$ by V$^{45+}$, or other elements from the fifth column of the periodic table, would effect the required doping without an oxygen deficiency. Here, a target of V$_2$O$_5$, or VO or V$_n$O$_{2n+1}$, or V$_n$O$_{2n-1}$, with n an integer, would be appropriate.

In the high energy non-polar phase, the doped electrons cause most of the Fe$^{3+}$ to be reduced to Fe$^{2+}$ and a mixture of these two ions causes the FeO$_2$ layer to conduct. The Fermi level lies in the t$_{2g}$ Fe levels at about 2 eV above the common O valence band of the (La,Ti)O and FeO$_2$ layers. The LaO+ and AlO$_2$-layers apply a compressive pressure of about 100 GPa on the BFO layer, sufficient to suppress the polar distortion, and to push the Fe into the LS state. Thus, when LaO+ is replaced by TiO2+, and/or when oxygen deficient sites occur, Fe$^{3+}$ is reduced towards Fe$^{2+}$ and the transition to the LS state is facilitated by the increased compression of the FeO$_2$ layer. The HS to LS transition follows in part because the critical crystal field parameter 10Dq for LS Fe$^{2+}$ is roughly 2-4 eV, and about half that for LS Fe$^{3+}$. Overall Fe$^{3+}$(HS) is reduced towards Fe$^{2+}$(LS). The conduction band of the AlO$_2$, layer reflects Al$^{3+}$ as found in Al$_2$O$_3$. The electron affinity is approximately 1 eV and the band gap E$_g$ about 8 eV, placing the Al s-p-conduction band at roughly 8 eV above the Fermi energy E$_F$ in the non-polar phase.

In the low energy polar phase, the polarization of the BFO is screened by the re-oxidation of Fe$^{2+}$(LS) to Fe$^{3+}$(HS) and the reduction of Al$^{3+}$ to the sub-oxidation state Al causing the AlO$_2$ layer to conduct. With increasing polarization p of the BFO, there is a charge transfer of a single electron per formula unit from the FeO$_2$ to the AlO$_2$, layers.

The high energy phase is quasi-stable with a large barrier between it and the low energy phase. Increasing the polarization p of the BiO layer, the electrical potential of the FeO$_2$ layer increases, driving, e.g., the redox reaction Fe$^{2+}$(LS)+ Ti$^{4+}$ to Fe$^{3+}$(HS)+Ti$^{3+}$, and shifting up the chemical potential to about 4 eV above the O band and well into the Ti t$_{2g}$ band. Despite a similar down shift of the AlO$_2$ layer potential leaves the Fermi energy E$_F$ in the energy gap of this layer. Because the BFO layer is not screened, this polarization p costs an energy of the order of a few electron volts. Only when E$_F$ reaches the bottom of the Al s-p-band does a charge transfer between the Ti t$_{2g}$ and Al s-p-bands starts and the energy decrease towards the low energy phase. By design, the highly insulating AlO$_2$ layer is included, in part, to provide this large barrier between the two phases.

There is a compressive electrical force of about 110 GPa between the A– and B+ layers of a A$^{3+}$B$^{3+}$O$_3$ perovskite. Given the c-axis lattice parameter increases by 20% upon the polarization of the BFO layer the polarization does about 2.2×10$^{10}$ J/m$^3$ of mechanical work and is the same as the electrical work done in transferring one election trough a potential difference of about 10V. To this is to be added energy of about 1×10$^{10}$ J/m$^3$ associated with the HS to LS transition implying a terminal voltage of roughly 15 Volts. In general, the potential difference between the positive and negative layers of ionic crystals is of order of tens of volts. A charge of 2C/m$^2$ on AlO$_2$ layer is required to screen the fully polarized BFO leading to a voltage drop of about 23V across the double layer comprising the surface and AlO$_2$ layer screening charges. Given the gap is 8 eV, this lowers the bottom of the Al conduction band to 15 eV below original top of the common oxygen band. Estimating the Fermi level is 2 eV above bottom of this Al band, and that the Fermi level in the high energy phase was 2 eV above the top of the oxygen bands, leads to a downward shift of this level by the 15 eV and correctly matches the terminal voltage. It is to be appreciated that the large band gap of the AlO$_2$ layer is important in this matching. These numbers are very approximate and are intended to illustrate the design parameters, of the various layers, to those versed in the art.

Figure 6:
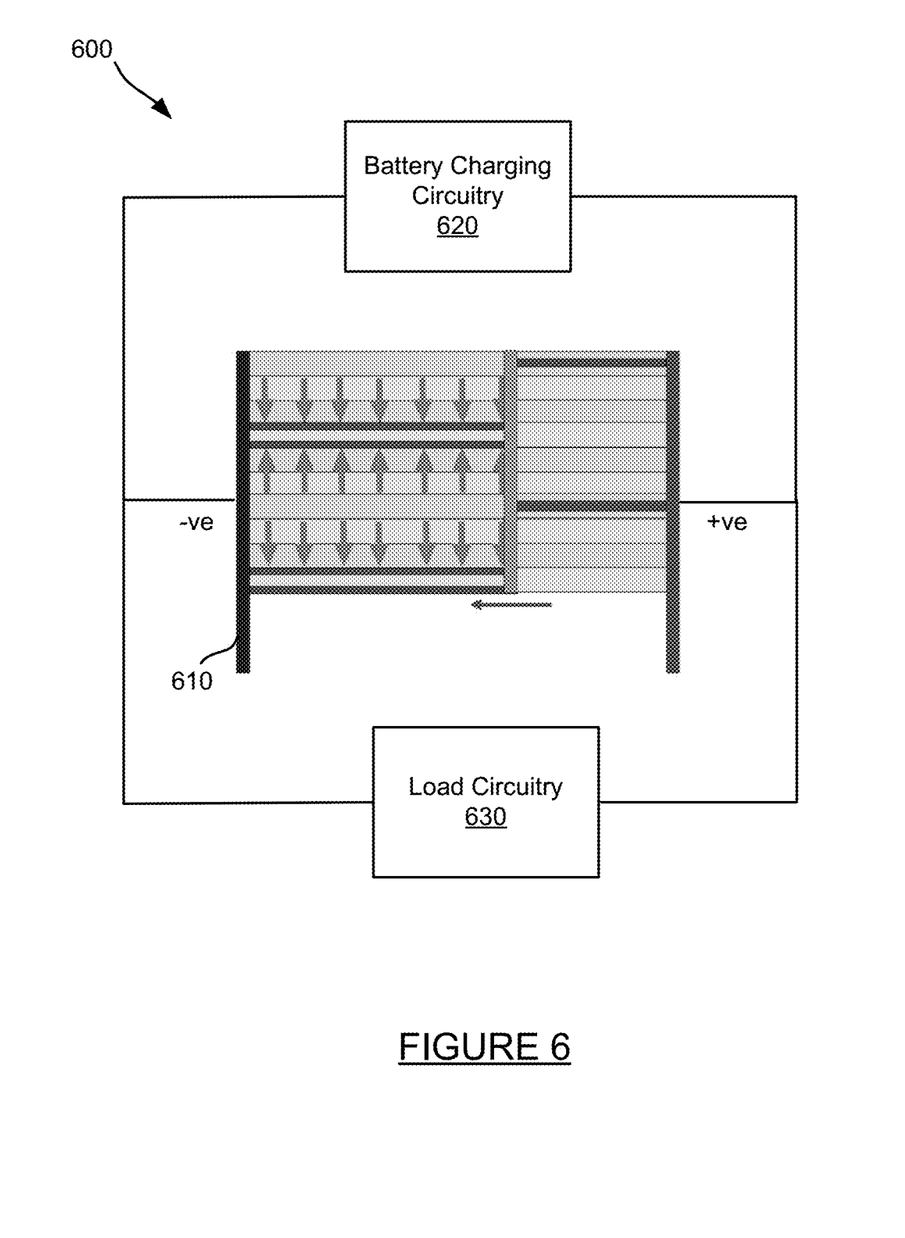
FIG. 6 illustrates a block diagram of the tri-color ordered triple perovskite coupled to charging circuitry and load circuitry.

FIG. 6 illustrates a block diagram of the tri-color ordered triple perovskite coupled to charging circuitry and load circuitry. The battery 610 is coupled to battery charging circuitry 620 and load circuitry 630. Battery charging circuitry 620 can be used to charge the battery, for example to a voltage of 10-20V. A charged battery 610 can be used to provide charge to load circuitry systems 630 (i.e., discharge).

Figure 7:
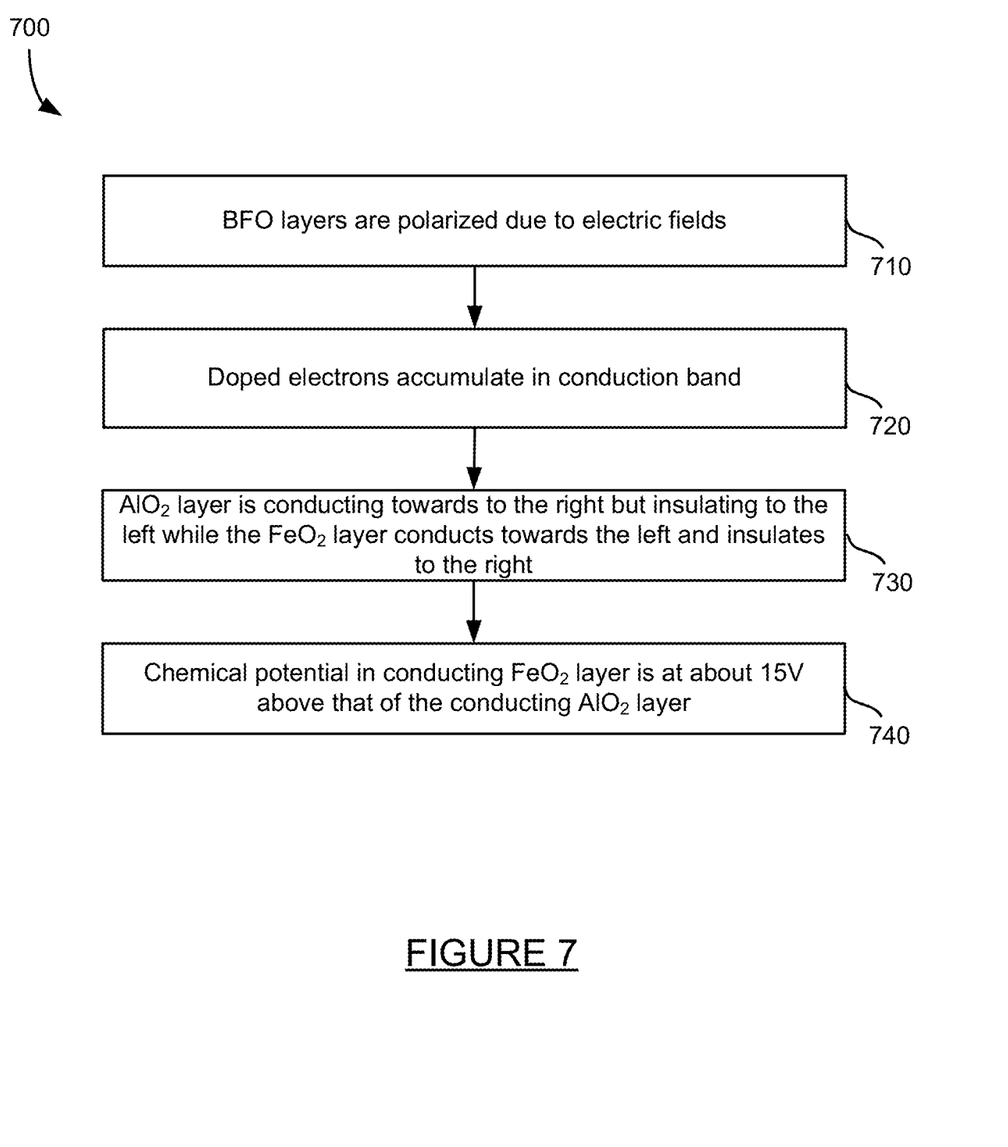
FIG. 7 illustrates a method for charging the energy storing device.

FIG. 7 illustrates a method for charging the energy storing device beginning from the low energy polar state. In the polar state, at step 710, each BFO layer is polarized in an alternating pattern as to the left (see FIG. 5) due to the internal electrical field produced by layers A≡LaO+ (530) and D≡AlO$_{2-}$ (560). When biased by the external charging circuit, in step 710, electron from the external source exert a pressure on the phase wall moving it to the left.

The doped electrons, at step 720, accumulate in the conduction band of the D≡AlO$_{2-}$ (560) layer in order to screen the BFO polarization. For example, due to doping such as Ti, V and/or oxygen deficiencies, the AlO$_2$ layers is conducting to the right of the wall but insulating to the left, while the FeO$_2$ layer is conducting to the left of the wall but insulating to the right.

In step 730, the doped conduction electrons are adiabatically pushed to the left out of the D≡AlO$_{2-}$ (560) layer and into the B≡FeO$_{2-}$ (540) layer from the right. Removing screening conduction electrons from layer 560, in front of the phase wall, causes the BFO in that region to depolarize, moving the boundary to the left, as in step 710, and producing a displacement current between the 560 and 540 layers that assures the continuity of the total current as required by Maxwell's equations.

The Fermi level in the Al conduction band of layer 560 lies well below the top of the oxygen valence band of the B≡FeO$_{2-}$ (540) layer due to the large potential drop across the double layer comprising the polar BFO layer and its conducting screening charge on layer 560. At step 740, the charging voltage must exceed the chemical potential difference of about 15V.

Figure 8:
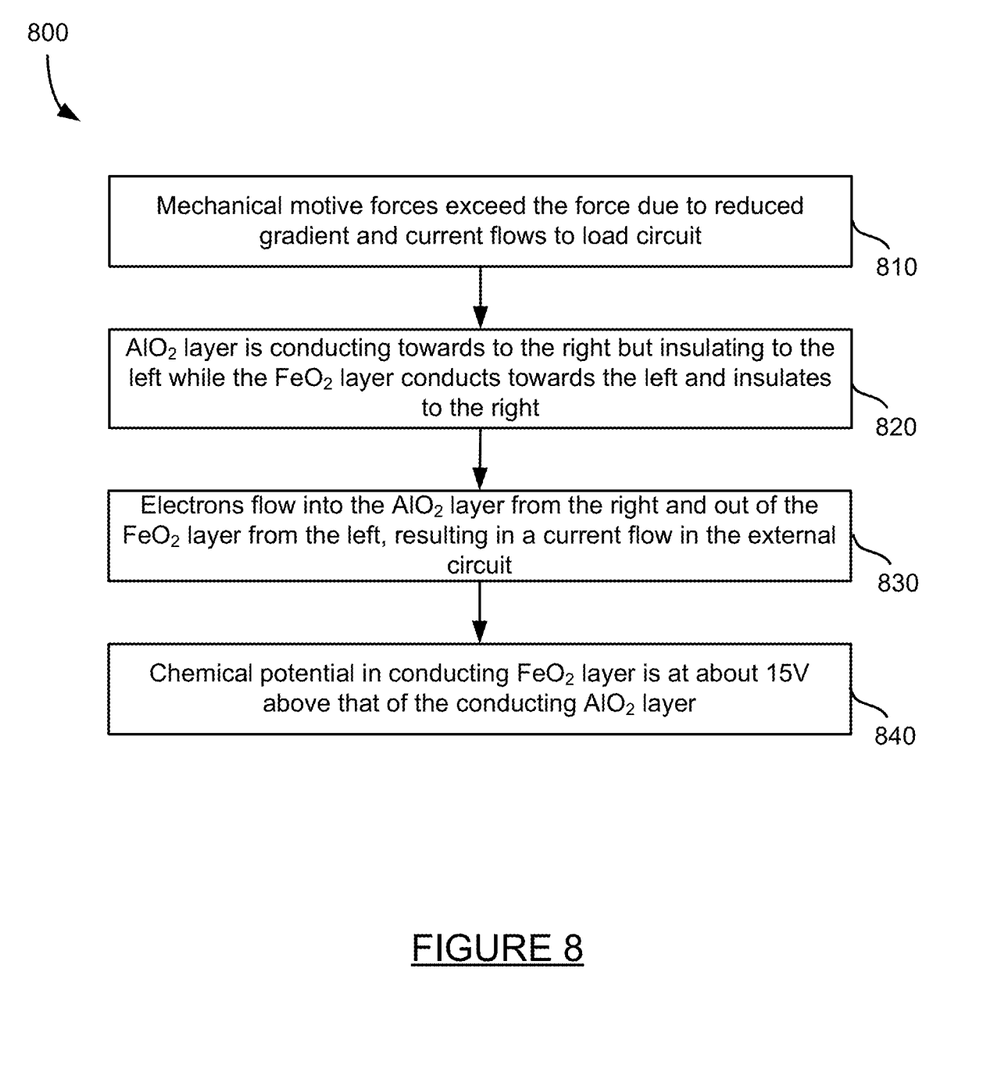
FIG. 8 illustrates a method for discharging the energy storing device.

FIG. 8 illustrates a method for discharging the energy storing device. With an open circuit, the equilibrium condition requires motive force exerted on the electrons to be equal and opposite to that due to the gradient in the chemical potential. The large energy barrier between the two phases as a function of ferroelectric polarization p and hence as a function of equilibrium wall position implies that thermal mechanical relaxation, i.e., by thermal phonons, is extremely slow on the charge-discharge time scale of days or more.

As with any battery, an external load circuit lowers slightly the chemical difference between the battery terminals and hence across the phase wall. At step 810, the mechanical motive force exerted by the wall on the electrons exceeds that due to the reduced gradient of the chemical potential and current flows in the load circuit. Internal pressures from energy density differences on two sides of the phase wall force the wall towards the right and vertical slice of the BFO layer becomes polarized.

The $AlO_2$ layer is conducting towards to the right but insulating to the left while the $FeO_2$ layer conducts towards the left and insulates to the right at step 820. Now the doped electrons of step 820, are pushed out of layer 540 and pulled into layer 560 as the wall moves to the right, this causing a current in the external circuit at step 830. In step 840, in order that the motive force drives an electron current, the chemical potential difference, and hence the voltage across the load, is slightly less than the open circuit of about 15V and reflects an internal resistance. Energy conservation implies the energy stored in the working material is delivered to the load circuit, except for that dissipated in the small internal resistance.

The battery is fully discharged when the wall is to the right (See FIG. 5) and the working material is in the low energy state while it is fully charged when the wall is to the left (See FIG. 5) and the working material is in the high energy state. Apart from the nano-metric dimensioned wall and the terminals all of the battery is occupied by the working material, and is thereby storing energy, unlike a chemical battery.

These examples of the present technology disclosed herein indicate there exist engineered metallic working materials that compete with Li-ion. Unlike chemical batteries the charge/discharge cycle corresponds to a phase change from one polymorph to another and, while there is ionic movement at the domain wall between phases, there is no fixed cathode, anode nor dielectric. The battery is entirely filled with the working material.

Phase transitions between insulating (or semi-conductor) and metallic phases can also be used as embodiments of the current invention. Illustrative examples are $VO_2$ and $V_2O_3$ and more generally the Wadsley $M_nO_{2n+1}$ and Magnéli phases $M_nO_{2n-1}$, where n is an integer, and where M is a 3d 4d or 5d transition metal, e.g., V,Ti,Mo,Nb or Fe that easily assume more than one valence. Invariably a first order metal to insulator transition (MIT) involves a change in the lattice parameters and/or structure.

For a simple Peierls MIT transition there is one or more periodic distortions of the lattice such that a gap opens at the Fermi level of an otherwise metallic material, creating a charge density wave (CDW). Such a CDW and the related spin density wave (SDW) are often (weakly) first order. When such distortions are commensurate with the existing lattice, this amounts to a transition between two polymorphs with a different unit cell size. Despite the gapped Fermi surface, when rather the distortion is incommensurate with the underlying lattice, the CDW/SDW will slide leading to Frohlich conductivity. Working materials based upon incommensurate Peierls/Frohlich transitions are possible in which conduction is by the Frohlich mechanism in the gapped phase. Currently known examples of CDW/SDWs such as $K_{0.3}MoO_3$ or $NbSe_3$, etc., have rather low energy densities. In gauge theory description of the current invention, Frohlich conduction current is proportional to the connection $\vec{A}_p(\vec{r},t)$. It reflects a current carried by the coupled electron-phonon condensate. In a more mundane picture: when an electron scatters of a moving lattice structure, it exchanges not only momentum corresponding to the period thereby creating a gap, but, because of the motion, there is also a transfer of energy. The resulting gaps occurs at a different momentum for right and left moving carriers and hence there is a net conduction electron charge flow in what otherwise would be considered an insulator or semiconductor. Because of pinning Frohlich conduction only occurs above a certain threshold electric field and is resistive.

The same principle of Frohlich conduction offers an alternative understanding of the exchange of momentum and energy with a phase wall. Electrons that are reflected from the phase wall suffer a Doppler shift due to the finite wall velocity, i.e., exchange energy with the wall. This implies the incident and reflected momenta are again different and that the conduction electrons carry a net current that reflects the wall motion.

Superconductors, in common with a CDW/SDW, usually, also have a gaped Fermi surface and also have conduction electron current is proportional to the connection $\vec{A}_s(\vec{r}, t)$. Below a first order superconductive transition temperature $T_c$ a superconductor/metal phase wall produces an EMF. However most such transitions are, at best, weakly first order and the energy density for known superconductors is rather small.

Mott-Hubbard metal-insulator transitions usually occur between a higher energy paramagnetic metallic phase and a lower energy insulating anti-ferromagnetic or ferromagnetic phase. Such transitions reflect a competition between the kinetic energy of electrons in the metallic phase with the Coulomb and Hund's rule correlation energies and crystal field energies of the magnetic insulating phase. The Hund's rule energy is smaller in the LS state and often a HS to LS transition is associated with a Mott-Hubbard transition. Since the LS ionic radius is smaller, and by extension the radius in the same ion in the metallic state (different from the "metallic radius"), than the HS equivalent this transition is often first order and associated with a polymorphic transition. In the illustrative examples $M_{2n}O_{2n+1}$, Mott-Hubbard and Peierls like transitions are mixed and compete. The half-filled magnetic $3d^5$ configuration has a particularly large Hund's rule correlation energy as compared to $3d^4$ and $3d^6$ and Mott-Hubbard transitions can also drive, or be driven by, charge transfer between ions, a feature of particular interest for battery designs.

In its simplest implementation, a battery based upon a metal/insulator phase wall constitutes a capacitor in which a higher energy metal phase contributes to the chemical capacitance. However, as described herein, the terminal voltage reflects a constant EMF corresponding to the difference in the energy density of the two phases. Ampère's law implies the total current is always continuous. In this simplest embodiment this continuity is assured by the displacement current $\partial D/\partial t$ that includes $\varepsilon_0 \partial E/\partial t$ this current for free space and $\partial P/\partial t$ reflecting the displacement of the ions comprising the dielectric, i.e., the working material. In order that the electric field remains in reasonable bounds, avoiding electrical breakdown, and for a high capacity battery, it is necessary that the dimensions of the insulating phase, in the direction of the displacement current, be limited to tens of atomic layers. For such thin layers, leakage and tunneling currents lead to impractically short self-discharge times.

In some instances, a battery of the present technology based upon a metal/insulator phase transition consists of two layers. The working material forms one layer and a suitable "drain" conductor the second layer. In the insulating low energy phase of the working material, the parallel drain conductor causes this part of the composite material to conduct to the left. In order to avoid excessive charge transfer, the drain layer Fermi energy should lie just below the top of the valence band of the insulating working material. The chemical potential of the right electrode corresponds to this energy. The drain layer is designed to contain the number of electrons, per unit cell, such that, as the phase wall is forced to the left, during charging, by the addition of electrons from the right electrode, the drain layer is completely depleted of electrons. It follows, on the metallic side of the phase wall of the working material, the drain layer is a charged insulator with a charge that exactly matches the charge fed into the metallic side of the working material from the right electrode. There is an electrical double layer at the drain layer to metallic working material interface leaving the composite material neutral. The chemical potential of this side and hence the right electrode is the higher chemical potential of the conducting phase of the working material. During discharge electrons leave by the right electrode with its higher chemical potential and enter at the lower potential energy of the drain layer. This difference in chemical potential is the open circuit voltage of the battery. The effect of the drain layer if to convert the metal/insulator phase transition of the working material into a metal/metal transition of the composite material.

Of the many metal oxides $M_nO_{2n+1}$ making phase transitions between insulating (or semi-conductor) and metallic phases $VO_2$ is a much studied illustrative example. It undergoes a transition from the low energy gapped semi-conducting phase, stable at room temperature, to a higher energy metallic phase at either higher temperatures or pressure. In narrow single crystal rods, the application of a voltage nucleates the high energy metallic phase and a domain wall can be observed to propagate down the working material as in the preferred embodiment of the battery. The experimentally determined stored energy density is $\approx 0.24 \times 10^9$ J/m$^3$ and comparable with state of the art Pb-acid. This energy density corresponds to an energy difference of about ⅓ eV per atom and hence a terminal voltage $\approx 0.33$V. Due to the negative resistance of the insulator to metal transition, with a suitable external circuit, the system will periodically inject domain walls between the insulator and metal phases. As such, a wall leaves one end of the rod, and the voltage makes a step corresponding to the chemical potential difference across the wall consistent with the estimate of 330 meV. This does not function as a battery because, at ambient conditions, the electronic conductivity due to excitations above the gap is in parallel and more conductive than the circuit containing the EMF.

The semi-conducting phase of $VO_2$ might be made metallic by doping holes into the oxygen valence band. The Wadsley phases $M_nO_{2n+1}$, e.g. $V_6O_{13}$ have V with formal V charge greater than +4. This high valence state is identified with a hole in the oxygen band and might be expected to be a conductor in its ground state. In fact, $V_6O_{13}$ has an insulating ground state and undergoes an insulator to metal transition at ~150 K. The crystal structure adjusts so there is a periodic charge on the V atoms. There are two sites with nominal charges of 4+ and a single site with 5+ and a gap opens at the Fermi energy. Similarly, the Magnéli phases $M_nO_{2n-1}$ might be expected to be electron doped and be metallic. In fact, e.g., $V_3O_5$ has a formal V valence of 5/3 but has an insulting ground state with an insulator to metal transition at 430K. The lattice structure accommodates $V^{3+}$ and $V^{4+}$ in an ordered manner. The oxide $V_7O_{13}$ remains metallic to the lowest temperatures but undergoes a transition from an anti-ferromagnetic to paramagnetic metal at about 40K. To the extent that this transition of (weakly) first order this magnetic transition might be used as an embodiment of the present invention. Hydrogenation to $H_{0.64}VO_2$ does leads to metallization of low temperature monoclinic phase of $VO_2$ and the transition to rutile phase might also be used as an embodiment of the present invention.

Rust, $\alpha$-$Fe_2O_3$, at the stoichiometric composition is an insulator with the nominal valence $Fe^{3+}$, but at $\approx 60$ GPa undergoes a first order transition to a metal with, at least, a partial HS to LS transition and a volume change of $\approx 10\%$. The volume change implies a more than adequate energy density of $\approx 5 \times 10^9$ J/m$^3$. It is this energy, associated with a transition from HS to LS is exploited in the metal to metal transitions of $LaCu_3Fe_4O_{12-x}$ and $LaBi_2AlFe_2O_{9-x}$, but many other possibilities exist and other ions such as Mn, Co and Ni along with 4d and 5d elements can undergo such spin transitions. Directly $\alpha$-$Fe_2O_3$, or one of other $Fe^{3+}$ polymorphs, with a high work function metal, e.g. Ni (work function of ~5.25 eV) as a drain layer might be used as a battery embodiment.

In one implementation, an insulator to insulator phase battery constitutes a capacitor in which the working material forms the dielectric. It is charged and discharged using displacements currents. Simple ionic oxides, e.g., $SiO_2$ or ZnO have polymorphs that differ in energies by ~1V per unit cell and have several phases that are stable under ambient conditions. It is also established that the application of modest electric fields ~$10^6$ V/m can induce complicated structural phase transitions, e.g., in $Pb(Zn_{1/3}Nb_{2/3})_{1-x}Ti_xO_3$. An embodiment of the phase battery can be based upon the transition between ambient stable polymorphs near the electrical breakdown. In such a battery the phase boundary is driven by displacement currents in both co-existing phases. This would also function as a low energy phase memory device.

In another implementation, an insulator/insulator phase battery, as with a metal/insulator battery, has working material as one A-layer and a "drain-source" second conducting B-layer. Invariably when the working material changes phase the charge transfer to and from the metallic B-layer changes and with this the chemical potential of this layer. This then functions as a metal/metal battery, i.e., the EMF generated in the phase wall maintains a chemical potential difference between the high and low energy phases. An illustrative example would have $SO_2$ as working material and graphene as the drain-source layer. Calculation shows, there chemical potential changes of the order of volts when graphene, the drain-source layer, interfaces with the polar oxygen surface of $SO_2$, as working material, that are different for the $\alpha$-quartz (0001) surface and cristobalite (111) surfaces.

A greater design flexibility is afforded by separating the "drain" and "source" layers. In such an embodiment, there is "source" A-layer followed by a B-layer of the working material and followed by the "drain" C-layer. A repeated sequence ABCBA would be appropriate. In the high energy state, the source A-layer is metallic, e.g a monolayer of Ca (work function 2.9 eV and Fermi energy 4.7 eV) with the Fermi energy aligned below the bottom of the conduction band of the working material of layer B while the drain is insulating, e.g., MgO (negative electron affinity~−0.5 eV), with the bottom of its conduction band roughly aligned with that of the working material. The working material corresponds to a non-polar plane, e.g., NaCl(100) (electron affinity 0.5 eV), of a polar crystal. The low energy state corresponds to a polar plane of the same material, e.g., NaCl(111) or the CsCl-structure polymorph of the same material. (These polar structures differ by the coordination of the ions.) In order to be screened, the NaCl will polarize towards the NiO layer, i.e., the Cl⁻ will be adjacent to the K two monolayers depleting (K is oxidized to K⁺) this layer of electrons. By the same token the Mg is oxidized reduced from $Mg^{2+}$ to metallic $Mg^0$. Given the planes of NaCl(111) are separated by about 0.25 nm, there is a voltage drop of ~25V across this layer. Depleting the Ca layer requires an upward shift of 7.6 eV and implying a (maximum) downward shift of the chemical potential of 15V. The estimated energy density is ~25 J per plane or about $10^{10}$ $J/m^3$.

It is also possible to have a domain or phase wall that separates regions with different chemical compositions, but which are connected by a topotactic chemical reaction. Such reactions might involve hydrogen, protons, oxygen, water, the oxides of carbon along with light hydrocarbons and their ions.

An illustrative example is based upon a perovskite $ABO_3$ in which A is a lanthanide such as La, Y, Ce and B is a transition metal such as Ti, Fe, Co, V, Zr, Cr, for example, $LaFeO_3$. This is a good electrical insulator with a band gap of about 2 eV between the filled oxygen bands and empty $t_{2g}$ d-levels of the $Fe^{3+}$.

The intercalation of hydrogen reduces up to roughly one half of the iron to $Fe^{2+}$ resulting in a good proton, i.e., $H^+$, and n-type electrical, conductivity. Electrons are added to the Fe $t_{2g}$ d-band while the protons bond to oxygen to give a mobile —OH ligand.

The iron valence of strontium doped $La_{1-x}Sr_xFeO_{3-x/2}$ has again $Fe^{3+}$. For this insulator, charge balance implies one oxygen vacancy for two Sr. Filling the oxygen vacancies in a topotactic reaction results in $La_{1-x}Sr_xFeO_{3-y}$, $y<x/2$, a p-type conductor with two electron holes in the oxygen valence band per added oxygen.

Figure 9:
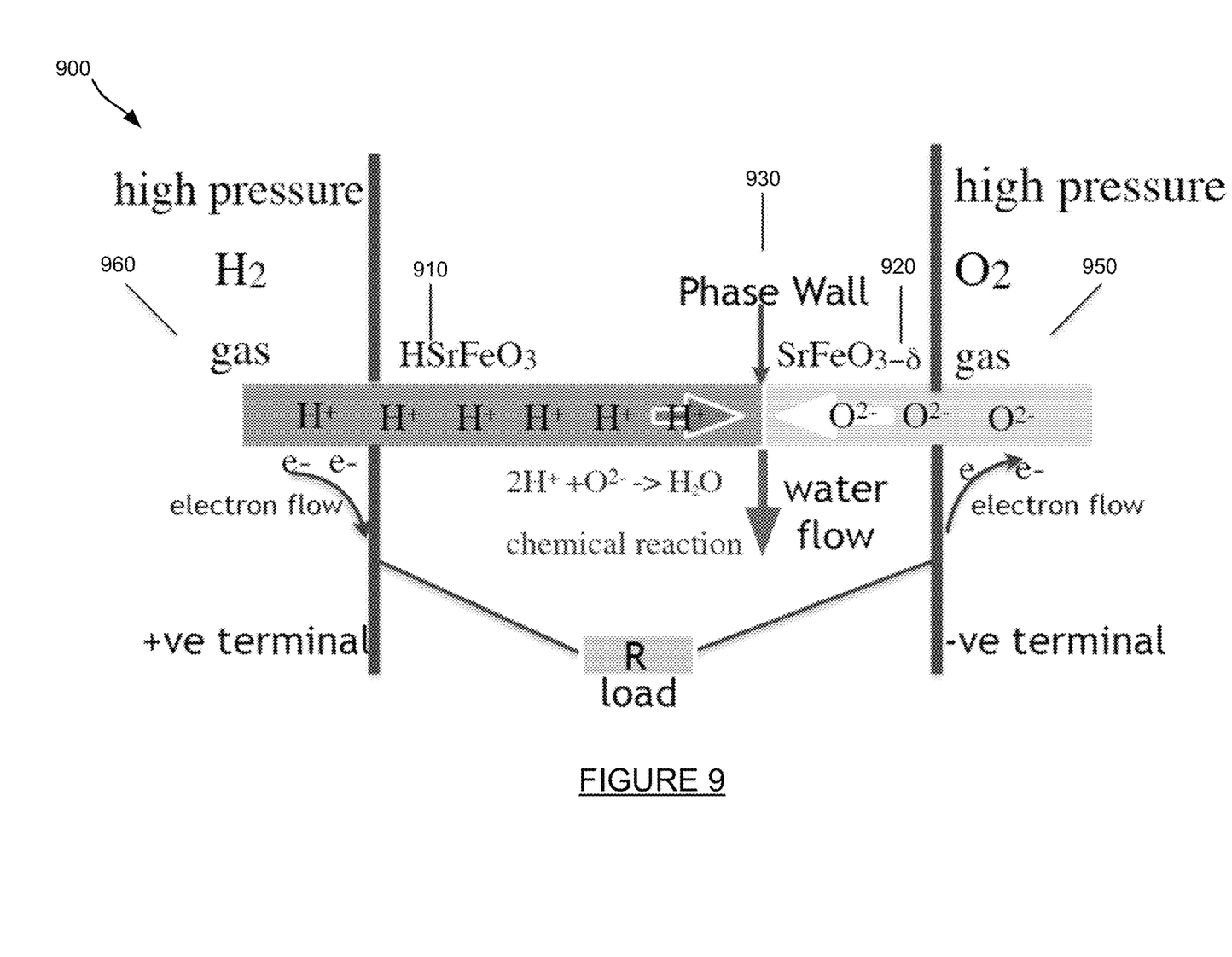
FIG. 9 illustrates a schematic of a phase transition battery based upon different chemical phases.

FIG. 9 illustrates a schematic a phase transition battery based upon different chemical phases. In the illustrative example of FIG. 9, to one side of the phase wall 930 is a n-type electrical conductor corresponding to hydrogen intercalated $H_yLa_{1-x}Sr_xFeO_{3-x/2}$ 910 while to the other side is the same material $La_{1-x}Sr_xFeO_{3-y}$ 920 doped with oxygen. At the wall, the reaction $2H^+ + O^{2-} \leftrightarrow H_2O$ occurs resulting in insulating $La_{1-x}Sr_xFeO_{3-x/2}$ with intercalated neutral $H_2O$. Since water expands the perovskite lattice and since the positive LaO and negative $FeO_2$ layers are subject to a strong, order 100 GPa, compressive force the $H_2O$ is ejected through the surface of the working material, this consistent with the fact that $LaFeO_3$ does not hydrate. In a primary battery, the reaction proceeds until all of the intercalated hydrogen and doped oxygen fuel is consumed in the production of water. For the secondary cell illustrated in FIG. 9, continuous sources of hydrogen (940) and oxygen (950) are provided at high pressure thereby realizing a fuel cell. The ejection of $H_2O$ can be facilitated by suitably cut crystal surfaces.

The EMF of 1.23V associated with the over-all reaction $2H+O \leftrightarrow H_2O$ maintains the chemical potential of Fe $t_{2g}$ d-band at one side of the wall at about 1.23V above that in oxygen valence band at the other side of the wall. As the topotactic reaction proceeds, this EMF drives an electrical current through an external circuit. Within the wall, with an open circuit, the non-conservative EMF cancels that due to the gradient in the electronic chemical potential.

Such an electrical energy storage device might be charged, reversing the topotactic chemical reactions, and converting water into hydrogen and oxygen. For suitable working materials, such as $La_{1-x}Sr_xFeO_{3-y}$, charging can be also realized upon the exposure the phase wall to visible light.

Another example of a working material would be $SrFeO_x$. As brownmillerite $SrFeO_{2.5}$ with a nominal charge balance $Sr^{2+}$ and a $Fe^{3+}$ this is a good electronic insulator and can be hydrated by a topotactic reaction to $HSrFeO_3$, an electronic insulator, with a high density of protons and a defect free oxygen lattice, leading to a high proton, but low oxygen ionic conductivity. In contrast the $SrFeO_3$-δ perovskite phase is an electronic conductor with many oxygen defects leading to a good low temperature oxygen ionic conductor. A topotactic reaction at the phase wall produces $H_2O$.

The foregoing detailed description of the technology herein has been presented for purposes of illustration and description. It is not intended to be exhaustive or to limit the technology to the precise form disclosed. Many modifications and variations are possible in light of the above teaching. The described embodiments were chosen to best explain the principles of the technology and its practical application to thereby enable others skilled in the art to best utilize the technology in various embodiments and with various modifications as are suited to the particular use contemplated. It is intended that the scope of the technology be defined by the claims appended hereto.

What is claimed is:

1. An electrical energy storage device, comprising:
a first portion of a working material having a first phase and a first energy density;
a second portion of the working material having a second phase with a second energy density that is different than the first energy density; and
a phase wall physically separating the first portion and the second portion of the working material, wherein the first phase has a first structure and the second phase has a second structure, wherein the first structure deforms into the second structure within the phase wall,
wherein as the working material undergoes a phase transition between the first phase and second phase, the phase wall moves,
and wherein during charge of the electrical energy storage device electrical energy is added to the device, and wherein during discharge of the electrical energy storage device electrical energy is extracted from the device.

2. The energy storage device of claim 1, wherein the working material is a prism in which a first terminal of an external electrical circuit is connected to a first prism surface and a second terminal of the external electrical circuit is connected to a second prism surface, wherein the phase wall surface lies between the first prism surface and second prism surface.

3. The electrical energy storage device of claim 1, further comprising coupling a first end of an external electrical circuit to the first portion of the working material and connecting a second end of an external electrical circuit to the second portion of the working material.

4. The electrical energy storage device of claim 1, wherein the first portion, the second portion, and the domain wall are of the same chemical material.

5. The electrical energy storage device of claim 1, wherein the first phase has a first crystal structure and the second phase has a second crystal structure that differs from the first crystal structure, wherein the first structure deforms into the second structure within the phase wall.

6. The electrical energy storage device of claim 1 wherein the first portion and the second portion are of a different chemical material.

7. The electrical energy storage device of claim 6, wherein the first portion and the second portion differ by one or more chemical species wherein the phase wall delimits the first potion with a higher concentration from the second portion with a lower concentration of those species.

8. The electrical energy storage device of claim 7, wherein a chemical species is added or removed from one or both of the first portion and the second portion, and wherein a chemical reaction occurs within the phase wall, the phase wall bring free to move.

9. The electrical energy storage device of claim 7, wherein the chemical species are protons, oxygen ions or light hydrocarbons.

10. The electrical energy storage device of claim 1, wherein the terminal voltage reflects the difference in electrical chemical potential between the first portion and the second portion.

11. The electrical energy storage device of claim 1, wherein the device can be charged from an electrical source and then at a later time discharged into a load.

12. The electrical energy storage device of claim 1, wherein the working material is magnetic, and one of the first portion and second portion is in high spin state and the remaining portion in a low spin state.

13. The electrical energy storage device of claim 1, wherein one of the first portion or the second portion has a first magnetic structure and the remaining portion has a different magnetic structure.

14. The electrical energy storage device of claim 1, wherein one of the first portion or the second portion differs from the remaining portion by an electronic phase transition.

15. The electrical energy storage device of claim 14 in which the electronic phase transition is a Mott transition.

16. The electrical energy storage device of claim 14, wherein the electronic phase transition is an inter-site charge transfer.

17. The electrical energy storage device of claim 16, wherein the inter-site charge transfer is driven by an electrical polar to non-polar transition.

18. The electrical energy storage device of claim 1, wherein the working material includes an ordered or disordered double, triple, or higher order perovskite.

19. The electrical energy storage device of claim 18 wherein the working material is a triple or higher order perovskite comprising of ferroelectric layers, ferroelectric bias layers and charge doping layers.

20. The electrical energy storage device of claim 19, wherein the device comprises a sequence of mono-layers— $AO^+$—$YO2^-$—$xO^+$—$BO2^-$—$XO^+$—$YO2^-$ derived from perovskite materials, (i) a highly polar ferroelectric material with chemical formula $XYO3$-y,
wherein y=0 comprises a $XO^+$ layer with a single positive charge e per X-atom and $YO2^-$ layer with a single negative charge −e per Y-atom,
(ii) non-polar material $ABO3$-x with similar, x=0, layers $AO^+$ and $BO2^-$,
wherein x and y reflect an oxygen deficiency and hence electron doping of the layers,
the $Y^{3+}$ having a d-shell with configuration $3d^n$, $4d^n$ or, $5d^n$ with n greater than zero and less than ten.

21. The electrical energy storage device of claim 20,
wherein $XYO3$-y is bismuth ferrite $BiFeO3$-y and wherein $ABO3$-x is $(La1-sZrs)AlO3$-x, $(La1-sTis)AlO3$-x, $(La1-sHfs)AlO3$-x, $(La1-sTis)AlO3$-x, or $(La1-s/2Vs/2)AlO3$-x,
with 0<s<1 such that, in addition to the oxygen deficiency electron doping x+y, net doping x+y+s=z~0.75-0.9 electrons per $ABO3$-x formula unit.

22. The electrical energy storage device of claim 20, wherein the AO electron doping layer is replaced by composite doping layer AO—$BO_2$—AO and the $BO_2$ electron doping layer is replaced with the composite layer $BO_2$—AO—$BO_2$.

* * * * *